United States Patent [19]
Cook et al.

[11] 4,028,694
[45] June 7, 1977

[54] A/D AND D/A CONVERTER USING C-2C LADDER NETWORK

[75] Inventors: Peter William Cook, Mount Kisco; Stanley E. Schuster, Granite Springs, both of N.Y.

[73] Assignee: International Business Machines Corporation, Armonk, N.Y.

[22] Filed: June 10, 1975

[21] Appl. No.: 585,629

[52] U.S. Cl. .................. 340/347 AD; 148/188; 340/347 DA
[51] Int. Cl.$^2$ ......................... H03K 13/02
[58] Field of Search ........... 340/347 DA, 347 AD; 148/188

[56] References Cited
UNITED STATES PATENTS

| | | | |
|---|---|---|---|
| 3,540,037 | 11/1970 | Ottesen | 340/347 AD |
| 3,570,114 | 3/1971 | Bean et al. | 148/188 X |
| 3,665,458 | 5/1972 | Mulkey et al. | 340/347 DA |
| 3,874,955 | 4/1975 | Arita | 357/51 |

OTHER PUBLICATIONS

Hoeschele, "Analog-to-Digital ———," J. Wiley & Sons, 1968, p. 190–194.

Primary Examiner—Thomas J. Sloyan
Attorney, Agent, or Firm—Sughrue, Rothwell, Mion, Zinn & Macpeak

[57] ABSTRACT

A C-2C analog-to digital and digital-to-analog converter is described, the C-2C designation referring to the arrangement of capacitance in a capacitor ladder network. The capacitors are formed in a monolithic, multilayer structure which includes a substrate, diffusion regions in the substrate, a polysilicon layer and an aluminum layer wherein the capacitances are formed between the aluminum layer and the polysilicon layer and between the polysilicon layer and the diffusion region, and these capacitances have the ratio of 2C to C respectively. The capacitor ladder network formed in the multilayer structure can be trimmed or adjusted electrically after manufacture to obtain the desired tolerances.

8 Claims, 8 Drawing Figures

A/D AND D/A CONVERTER USING C-2C LADDER NETWORK

BACKGROUND OF THE INVENTION

1. Field of the Invention

The present invention generally relates to analog-to-digital and digital-to-analog converter circuits, and more particularly, to a C-2C analog-to-digital and digital-to-analog converters wherein a capacitance ladder network is formed using monolithic, multilayer fabrication techniques and can be trimmed or adjusted electrically after manufacture to obtain desired tolerances.

2. Description of the Prior Art

The advantages of digital control, computation and communication are being applied to many diverse fields. These applications, however, often require analog-to-digital (A/D) and digital-to-analog (D/A) signal conversion. A/D and D/A converters using resistor ladder networks are well known and widely used. While these resistor ladder networks have been satisfactory for many applications, they have several disadvantages. Such networks must be made with many sections and, even then must be matched or trimmed to attain the desired accuracy. As a result, resistor ladder networks used in A/D and D/A converters are expensive to manufacture both in terms of parts and time of adjustment. In addition, resistor ladder networks are difficult to manufacture using integrated circuit techniques, and their maximum speed is limited by the time constant of the resistors and their associated distributed and parasitic capacitances.

More recently, capacitor ladder networks have been used in A/D and D/A converters. These networks offer the advantages of lower cost and higher speed of operation. An example of such a capacitor ladder network is disclosed in U.S. Pat. No. 3,665,458 to Mulkey et al. Mulkey et al. disclose a capacitor ladder switching network which may be fabricated using thin film techniques; but while distinct improvement over prior art resistor ladder network, the Mulkey et al. capacitor ladder network is not compatible with integrated circuit fabrication techniques and has no provision for trimming or adjustment.

SUMMARY OF THE INVENTION

It is therefore an object of the present invention to provide A/D and D/A converters employing a capacitor ladder network which may be manufactured using monolithic, integrated circuit fabrication techniques and which can be trimmed electrically.

The foregoing and other objects are attained by providing a capacitor ladder network formed as a multilayer structure that includes a substrate, diffusion regions in the substrate, a polysilicon layer and an aluminum layer wherein the capacitances are formed between the aluminum layer and the polysilicon layer and between the polysilicon layer and the diffusion regions such that the capacitances are in the ratio of 2C-C. In addition, trimming networks are provided which comprise a series of parallel capacitors formed by the diffusion regions in the substrate and the polysilicon layers. After the capacitor ladder network has been manufactured using monolithic, integrated circuit techniques, the trimming capacitors can be connected or disconnected using a laser technique to electrically trim the capacitor ladder network.

BRIEF DESCRIPTION OF THE DRAWINGS

The specific nature of the invention, as well as other objects, aspects, uses and advantages thereof, will clearly appear from the following description and from the accompanying drawings, in which.

DESCRIPTION OF THE PREFERRED EMBODIMENTS

Figure 1:
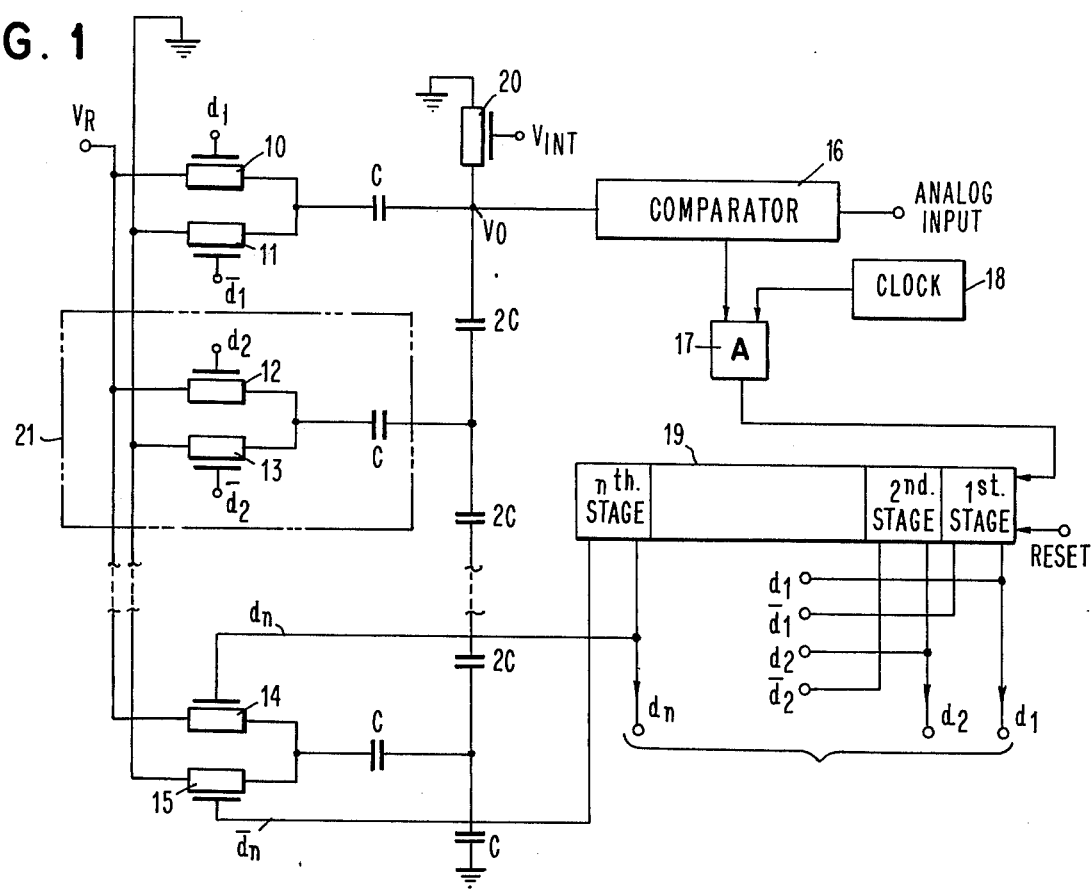
FIG. 1 is a schematic and block diagram of a typical A/D converter according to the present invention which also illustrates the operation of a D/A converter.

The circuit diagram for the C-2C network used in an A/D converter is shown in FIG. 1. The ladder network comprises a plurality of field effect transistor (FET) switch pairs 10-11, 12-13 and 14-15. One of each FET switch pair is connected in common to a reference voltage $V_R$ while the other FET of the switch pair is connected in common to ground potential. The FET switch pairs are connected to charge or discharge a capacitor having a capacitance C. Each of the capacitors having a capacitance value C, except the first and the last, are connected to a corresponding junction between a plurality of series capacitors having a capacitance value 2C. The first capacitor having a capacitance C is connected to an output junction or node at which an analog output voltage $V_o$ is developed. The last capacitor having a capacitance value C is connected to the junction between a capacitor of capacitance value 2C and a capacitor of capacitance value C, the latter being referenced to ground. The gate electrodes of the FET switch pairs are controlled by the true complement outputs of a source of binary signals, and these outputs are designated, respectively, $d_1\text{-}\bar{d}_1$, $d_2\text{-}\bar{d}_2, \ldots, d_n\text{-}\bar{d}_n$.

The structure thus far described constitutes a D/A converter. More particularly, if an independent source of digital signals constituted by the digits $d_1, d_2 \ldots, d_n$ is connected to the FET switch pairs, the corresponding analog output voltage $V_o$ will be developed at the output junction or node of the capacitor ladder network. The basic transfer function of this D/A coverter under ideal conditions is as follows:

$$V_o = V_R (d_1 2^{-1} + d_2 2^{-2} + d_3 2^{-3} + 0 \ldots + d_n 2^{-n}),$$

where $d_i$ are zero or one depending on the digital inputs.

The D/A converter forms an integral part of an A/D converter as shown in FIG. 1 where the analog output voltage $V_o$ of the capacitor ladder network is supplied as one input to the comparator 16. The other input to the comparator 16 is the analog input voltage which it is desired to convert to a digital output. The output of comparator 16 either enables or inhibits an AND gate 17. A source of clock pulses 18 is connected to an input of NAD gate 17 which, when enabled by the caparator 16, passes the clock pulses to counter 19. The stages of counter 19 are connected to the gates of the corresponding FET switch pairs, thereby completing a feedback loop. The output of counter 19 is also the digital output of the A/D converter.

In operation, counter 19 is initially reset so that all $d_i$ are zero, and the analog output voltage of the capacitor ladder network $V_0$ is set to ground by gating at FET 20 on with an initialization pulse $V_{int}$. The purpose of FET 20 is to permit both initialization and calibration of the capacitor ladder network. The output node of the capacitor ladder network must start at some fixed voltage for each A/D and D/A conversion. Leakage currents at this node can cause the voltage to drift slowly with time unless the node is connected to a fixed voltage at certain time intervals. Thus, each conversion is preceded by raising the voltage $V_{int}$ thereby grounding $V_0$. Moreover, once the output node of the capacitor ladder network has been initialized, any initial conditions on the intermediate nodes between the series capacitors having capacitance values 2C have no effect on the final output voltage which is only a function of changes in voltage in the network that occur after the initialization.

The A/D converter described above employs a count up algorithm. It should be evident to those skilled in the art that the C-2C network is equally applicable to other A/D conversion algorithms (for example, binary search) with suitable modification of the control and clocking.

Figure 2A:
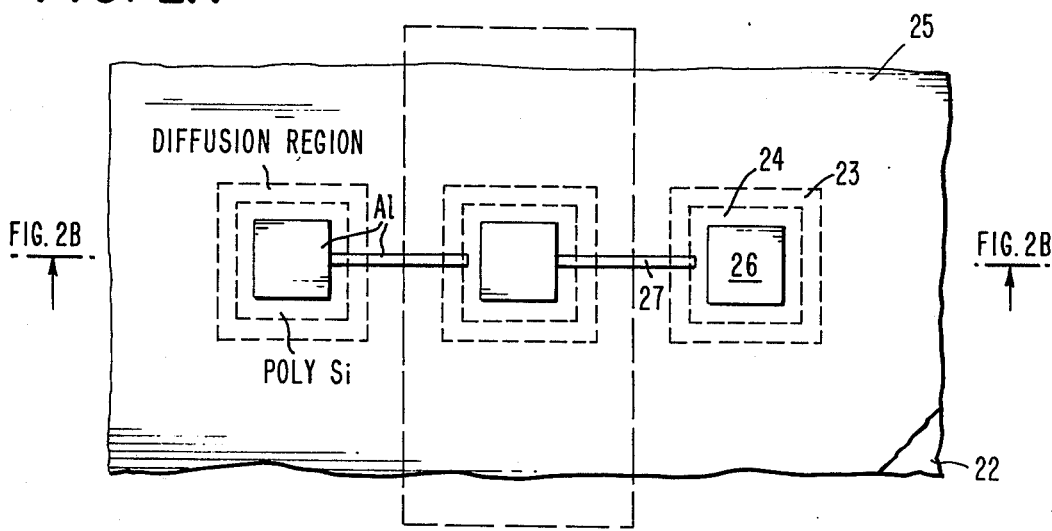
FIG. 2A and 2B show a plan view and a cross-sectional view, respectively, of the monolithic, multilayer construction of the capacitor ladder network according to the invention.
Figure 2B:
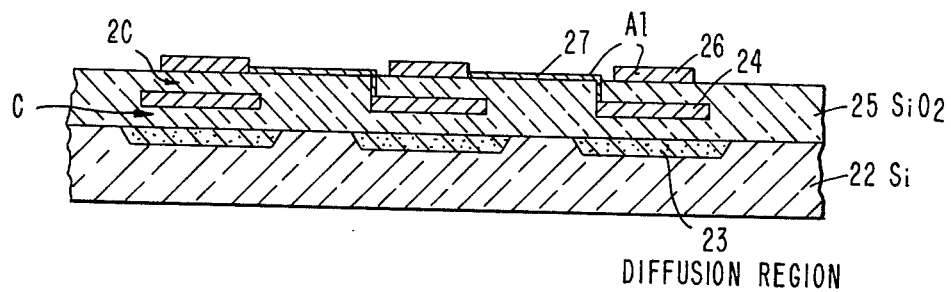

FIGS. 2A and 2B illustrate a preferred construction of the capacitor ladder network shown in FIG. 1. FIG. 2A is a plan view, and FIG. 2B is a cross-sectional view of a portion of the capacitor ladder network. The capacitor ladder network is formed using monolithic, integrated circuit techniques on a silicon substrate 22. First a silicon dioxide layer is grown on the silicon substrate. Then windows are opened in the silicon dioxide layer and a plurality of diffused regions 23 are formed in the substrate 22 by standard diffusion techniques. The silicon dioxide layer which regrows over the diffusion during this process is removed by conventional masking and etching techniques and then regrown to the desired thickness. Polysilicon is vapor deposited over the entire chip, masked, an etched to form regions 24. The capacitance between diffused regions 23 and polysilicon layer 24 is C. The capacitors having capacitance value 2C between aluminum layer 26 and polysilicon layer 24 are formed by growing a silicon dioxide layer on region 24. The composite silicon dioxide layer 25 is the result of this oxidation step and previous oxidation and etching steps in the process. Aluminum capacitor plate 26 and interconnecting lead 27 are formed by conventional deposition and etching techniques. The areas of diffused regions 23, polysilicon regions 24, and aluminum plates 26 together with intervening oxide thicknesses are designed to provide the desired C-2C ratio. The areas of the capacitors should be fairly large to minimize geometrical variations. During manufacture, it is desirable, although not essential, to minimize oxide variations as much as possible so that the desired C-2C ratio is achieved.

The parasitic capacitances on the FET switch pairs 10-11, 12-13, and 14-15 between diffusion and substrate and between gate and diffusion have no effect on network accuracy since it is only the total change in voltage at the input which determines the output voltage, not the transients which occur during the opening and closing of the switches. However, parasitics on the internal nodes, especially parasitics which are voltage dependent, can have a deleterious effect. These parasitics are almost completely eliminated in the multilayer structure shown in FIGS. 2A and 2B since each layer lies completely within the area of a lower layer except for the very small interconnection lead between the two layers on adjacent structures. Therefore, the parasitic capacitances from the aluminum layer to either the diffused layer or substrate and from the polysilicon layer to the substrate can be kept very small.

The capacitance looking into the network of any switch position is between one-half C and two-thirds C. For an oxide of 2,000A. between the polysilicon layers the diffused regions and 1,000A. between the aluminum layers and the polysilicon layers and for 10 mil by 10 mil areas, the C and 2C capacitances are 12.5 and 25 pf respectively. The time to charge the network through a switching device for at leat 10 bit accuracy ($\pm 0.01\%$) can be less than 50 n seconds with appropriate switching device sizes. The C-2C network power for 10 bit conversion at a one-half million conversions/second rate is less than a milliwatt.

An important feature of the C-2C network according to the present invention is that it can be "trimmed" electrically. If tolerances are included in the idealized network of FIG. 1, the output voltage may be written as follows:

$$V_o = V_r (\alpha_1 d_1 2^{-1} + \alpha_2 d_2 2^{-2} + \ldots + \alpha_n d_n d_n 2^{-n}) \quad (2)$$

where $\alpha_1, \alpha_2, \ldots \alpha_n$ are the actual weights of each bit position (in the nominal case, $\alpha n = \alpha_2 = \ldots = \alpha_n = 1$). Conceptually, for the case where tolerances are included, it would be desirable to adjust the voltage at each bit position so that the product of the actual weight of each bit position $\alpha_i$ and the adjusted voltage are a constant. In principle this can be done by replacing each input section 21 of the ladder network shown in FIG. 1 with the circuit shown in FIG. 3A. At each input position, the capacitance $C_i$ is divided so that some fraction $\gamma_i$ of the capacitance switches from ground to the reference voltage $V_R$ when the digital input $d_i$ to that bit position is changed. The remainder of the capacitance $(1 - \gamma_i) C_i$ is connected permanently to ground potential. The The venin equivalent circuit shown in FIG. 3B clearly shows that the total capacitance looking into the bit position is still $C_i$, whereas the voltage is now some fraction $\gamma_i$ of the reference voltage $V_R$. The equation of the output voltage becomes as follows:

$$V_o = V_R (\alpha_1 \gamma_1 d_1 2^{-1} + \alpha_2 \gamma_2 d_2 2^{-2} + \ldots + \alpha_n \gamma_n 2^{-n}) \quad (3)$$

by setting $\alpha_1 \gamma_1 = \alpha_2 \gamma_2 = \ldots + \alpha_n \gamma_n = K \leq 1$, equation (3) can be simplified to the following:

$$V_o = K V_R (d_1 2^{-1} + d_2 2^{-2} + \ldots + d_n 2^{-n}) \quad (4)$$

The only difference between this result and the transfer function under ideal conditions is that the output voltage is reduced by an amount K which is determined by the tolerances of the process. Once the worst case tolerances are known, K can be chosen to have a fixed value for all networks.

Figure 3A:
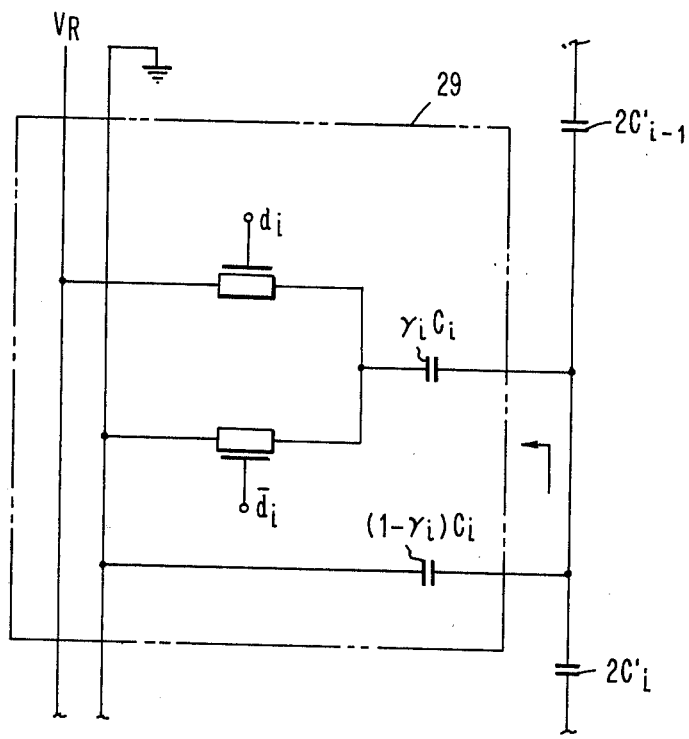
FIGS. 3A and 3B are schematic diagrams of a single section of the capacitor ladder network and its Thevenin equivalent circuit, respectively, which illustrate the theory of electrically trimming the capacitor ladder network according to the invention.
Figure 3B:
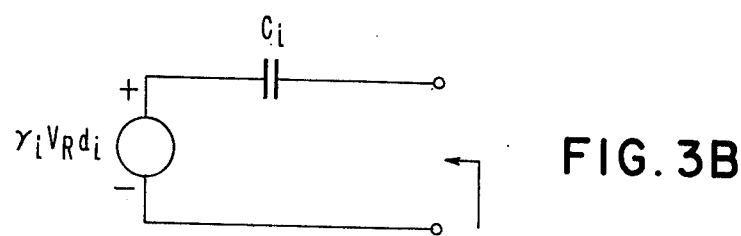
Figure 4:
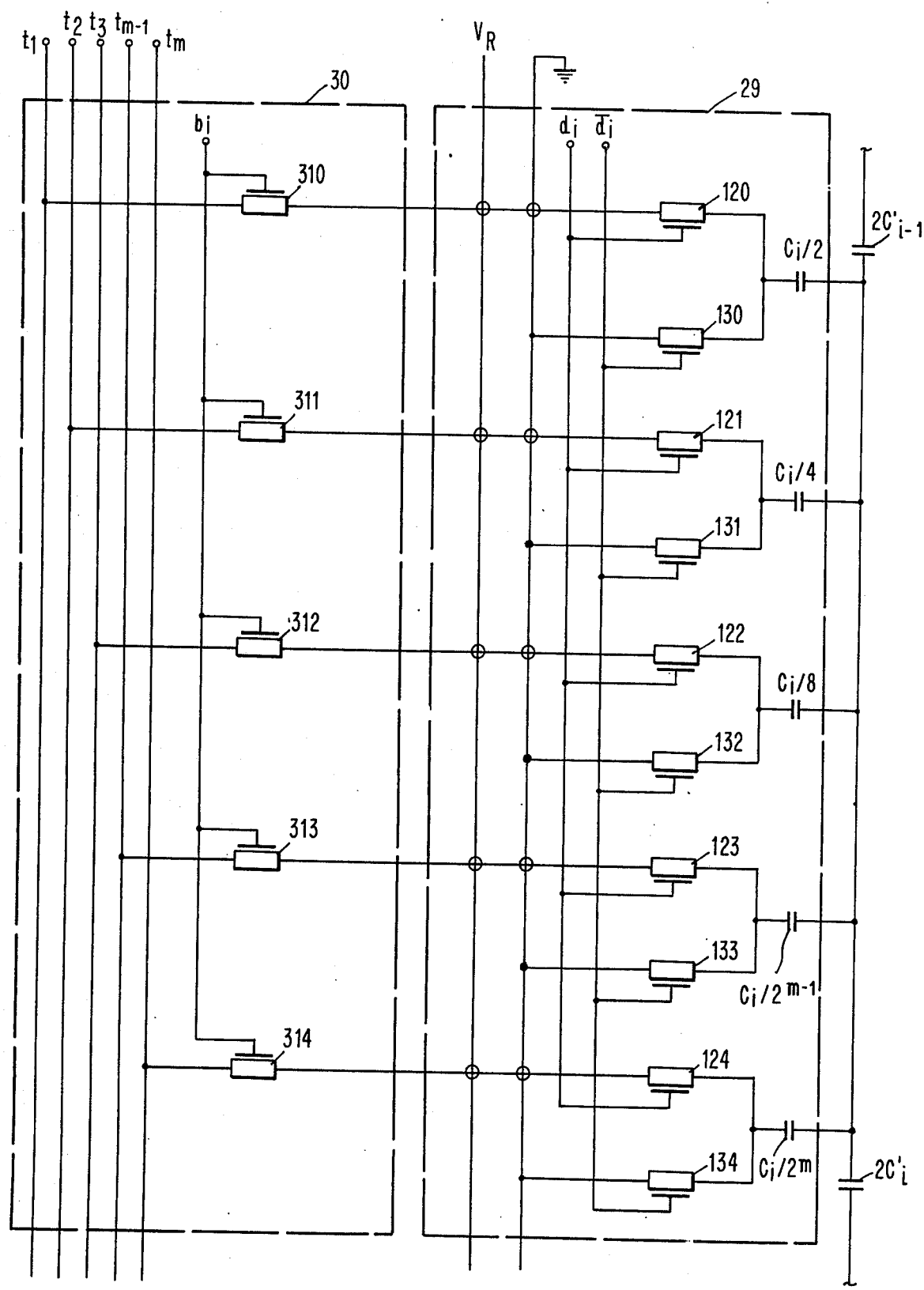
FIG. 4 is a schematic diagram of the single section of the capacitor ladder network showing the parallel trimming capacitors and the sites for laser formed connections and circuits to control network during trimming.

The realization of the theoretical network shown in FIG. 3A is shown by the detailed schematic of the trimming network in FIG. 4. As shown therein, a single section 29 of the capacitor ladder network includes a plurality of FET switch pairs 120-130, 121-131, 122-132, 123-133, and 124-134. The junction of FET switch pair 120-130 is connected to a capacitor having a capacitance value of $C_{i/2}$, the FET switch pair 121-131 is connected to a capacitor having a capacitance value $C_{i/4}$, and so forth. The gates of all the FETs 120-124 are connected in common to the $d_i$ gate input, while the gates of the FETs 130-134 are connected in common to the $\overline{d_i}$ gate input. FETs 130-134 are each connected to the ground line. The network is trimmed by electrically connecting each of the FETs 120-124 to either of the reference voltage line $V_R$ or the ground line. This is indicated in FIG. 4 by the open circles at the junctions of these lines. This is preferably accomplished by using laser forming techniques. Such techniques are described, for example, in *December 1974 International Electron Devices Meeting* sponsored by the Electron Devices Section of the IEEE, "Experimental Study of Laser Formed Connections for LSI Wafer Personalization," by L. Kuhn, S.E. Shcuster, P.S. Zory, G.W. Lunch, and J.T. Parrish. Thus, it will be understood that each section of the basic capacitor network shown in FIG. 1 is composed of a trimmable section of the type shown in FIG. 4 which may be electrically trimmed using laser formed connections. It is important to note that with this approach, the capacitance values are not being changed to "trim" the network, instead the effect is to adjust the input voltage swings of each section of the capacitor ladder network. Thus, as one bit is trimmed, the network transfer function from any of the bits to the output voltage $V_o$ remains unchanged. Since the network is linear, superposition holds and each bit position can be adjusted independently of all others.

The trimming circuitry 30 is used to determine whether the FETs 120-124 are connected to the reference voltage $V_R$ or the ground line. Test lines $T_1$-$t_m$, which are connected to external probe points, are common to all sections of the C-2C ladder network while test line $l_i$ which is also connected to an external probe point is associated only with the $i$-th section. In order to trim the $i$-th section of the network $d_i$ and $b_i$ are brought high turning on switching devices 120-124 and 310-314. The inputs to the $i$-th section of the C-2C network are now connected to the test pads $t_1$-$t_m$ through the series devices 120-124 and 310-314. Since the output voltage of the C-2C network should be $K \cdot V_r 2^{-i}$ when only section $i$ is exercised it is a simple matter to determine which of the FETs 120-124 should be connected to the reference voltage line $V_R$ and which should be connected to the ground line by means of a binary search algorithm. These connections can then be made using the laser formed connection techniques referenced above or by a number of well-known techniques such as fusible links or PROMs and FET switches. It should be noted that during the electrical timming of the $i$-th section of the C-2C network, the inputs to all other sections of the network, regardless of whether or not they have been trimmed, are connected to ground. This occurs because the complements $\overline{d_1}, \overline{d_2}$, ... $\overline{d_n}$ of the binary signals to these sections are high connecting each input to ground through devices 11-13 of FIG. 1. The only binary signal complement which is low when section $i$ is being trimmed is $\overline{d_i}$. In this way, the circuit of a trimmable section 29 in FIG. 3A is actually implemented during and after the trim process.

Figure 5A:
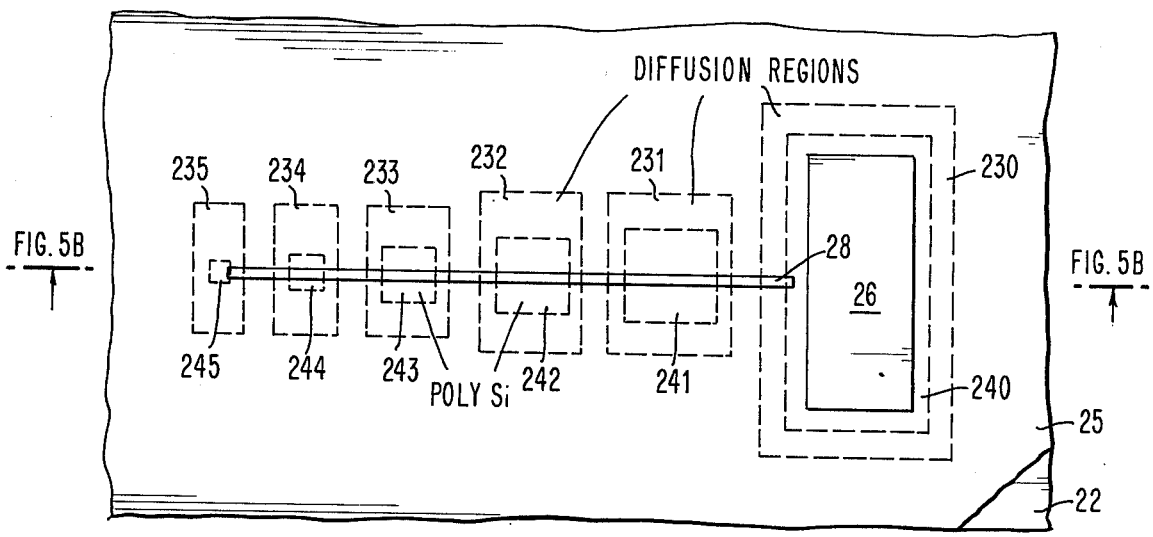
FIGS. 5A and 5B are a plan view and a cross-sectional view, respectively, of the monolithic, multilayer construction of a single section of the capacitor ladder network with its associated trimming capacitors.
Figure 5B:
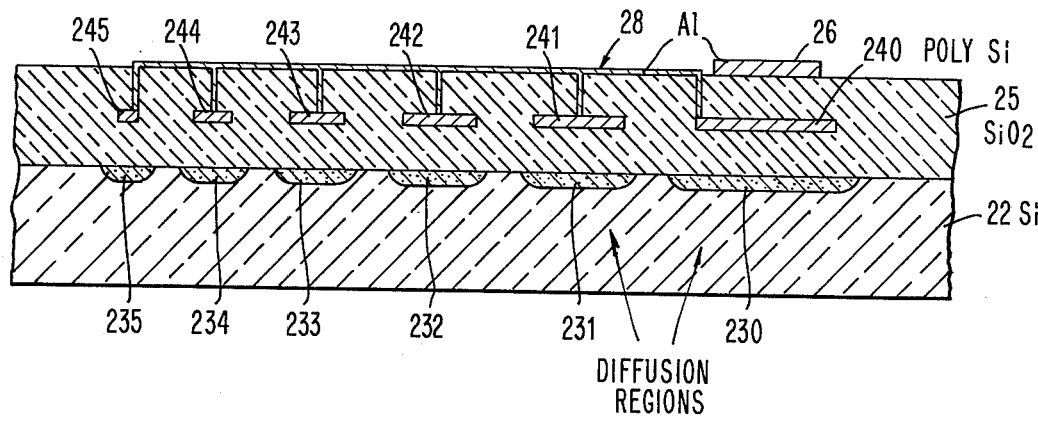

The monolithic, multilayer structure of the single section shown schematically in FIG. 4 is illustrated by the plan and cross-sectional views of FIGS. 5A and 5B, respectively. The structure is formed by the same standard processing techniques as previously described. By changes in the patterns of the appropriate masks a plurality of diffused regions 230 to 235 are formed in the substrate 22 and a plurality of polysilicon layers 240 to 245 are formed in the silicon dioxide layer 25 over the diffused regions 230 to 235. Finally an aluminum layer 26 is formed over the polysilicon layer 240. An aluminum strip 28 formed on the surface of the insulating layer 25 electrically connects all of the polysilicon layers 240 to 245 through contacts in layer 25. The nominal capacitance between the aluminum layer 26 and the polysilicon layer 240 is $2C_i$. The nominal capacitance between the polysilicon layer 240 and the diffusion region 230 is $C_{i/2}$, the nominal capacitance between the polysilicon layer 241 and the diffusion region 231 is $C_{i/4}$, and so forth.

A/D and D/A converters using C-2C capacitor ladder networks that can be trimmed electrically according to the present invention offer some rather unique advantages because of the capacitive structure which has been disclosed. Specifically, both the basic capacitor ladder network and the trimming networks for each of the sections of the capacitor ladder network are compatible with integrated circuit processing. Input parasitics and switching device tolerances do not affect the network, and because no static current is supplied by the reference voltage, high performance and low power consumption characteristics are achieved. Moreover, these advantages are achieved in a relatively low cost device which does not sacrifice accuracy but can realize substantial improvements in accuracy because the capacitor ladder network can be trimmed electrically.

It will be understood by those skilled in the art that the embodiments shown are only exemplary and that various modifications can be made in construction and arrangement within the scope of the invention as defined in the appended claims.

We claim:

1. An analog-to-digital converter comprising a digital-to-analog converter of the type employing a C-2C switched capacitor ladder network having a plurality of first capacitors having equal first capacitance values, a plurality of second capacitors having equal second capacitance values twice said first capacitance values, said plurality of second capacitors being connected in series between an output terminal of said ladder network and a first reference potential, each of said plurality of first capacitors being connected to respective junctions between each of said plurality of second capacitors, and a plurality of switch means operable to connect respective ones of said plurality of first capacitors to said first reference potential or to a second reference potential, a comparator having first and second input terminals and an output terminal, said first input terminal being connected to the output terminal of said ladder network and said second input terminal being connected to receive an analog signal to be converted, clock means controlled by a signal at the output terminal of said comparator for providing clock pulses, and a counter connected to said clock means for counting said clock pulses, said counter controlling said switched means, the improvement in said switched capacitor ladder network wherein said plurality of first capacitors and said plurality of second capacitors are formed as a monolithic, multi-layer integrated circuit comprising:

a substrate having a plurality of diffused regions formed in one face thereof equal in number to the number of said plurality of first capacitors, an insulating layer formed over said one face of said substrate and having disposed therein a plurality of conductive layers superposed to said plurality of diffused regions, said conductive layers being separated from said diffused regions by said insulating layer, and a plurality of metalized regions deposited on said insulating layer and superposed to said plurality of conductive layers, said metalized regions being separated from said conductive layers by said insulating layer, said plurality of diffused regions, said plurality of conductive layers, and said plurality of metalized regions having graduated areas such that each metalized region lies completely within the area of the corresponding conductive layer and each conductive layer lies completely within the area of the corresponding diffused region, the capacitors formed by said plurality of diffused regions and said conductive layers being said plurality of first capacitors and the capacitors formed by said plurality of conductive layers and said metalized regions being said plurality of second capacitors.

2. In a digital-to-analog converter of the type employing a C-2C switched capacitor ladder network having a plurality of first capacitors having equal first capacitance values, a plurality of second capacitors having equal second capacitance values twice said first capacitance values, said plurality of second capacitors being connected in series between an output terminal of said ladder network and a first reference potential, each of said plurality of first capacitors being connected to respective junctions between each of said plurality of second capacitors, and a plurality of switch means operable to connect respective ones of said plurality of first capacitors to said first reference potential or to a second reference potential, the improvement in said switched capacitor ladder network wherein said plurality of first capacitors and said plurality of second capacitors are formed as a monolithic, multilayer integrated circuit comprising:

a substrate having a plurality of diffused regions formed in one face thereof equal in number to the number of said plurality of first capacitors, an insulating layer formed over said one face of said substrate and having disposed therein a plurality of conductive layers superposed to said plurality of diffused regions, said conductive layers being separated from said diffused regions by said insulating layer, and a plurality of metalized regions deposited on said insulating layer and superposed to said plurality of conductive layers, said metalized regions being separated from said conductive layers by said insulating layer, said plurality of diffused regions, said plurality of conductive layers, and said plurality of metalized regions having graduated areas such that each metalized region lies completely within the area of the corresponding conductive layer and each conductive layer lies completely within the area of the corresponding diffused region, the capacitors formed by said plurality of diffused regions and said conductive layers being said plurality of first capacitors and the capacitors formed by said plurality of conductive layers and said metalized regions being said plurality of second capacitors.

3. The improvement in said switched capacitor ladder network as recited in claim 2 wherein said switch means comprises a plurality of FET switch pairs, one of said FET switches being connected between a corresponding one of said plurality of first capacitors and said first reference potential and the other of other said FET switches being connected between the same capacitor and said second reference potential, siad plurality of FET switch pairs being adapted to be controlled by a digital signal composed of a corresponding plurality of binary bits.

4. The improvement in said switched capacitor ladder network as recited in claim 3 wherein said substrate is silicon, said insulating layer is silicon dioxide, said plurality of conductive layers are polysilicon, and said metalized regions are aluminum.

5. The improvement in said switched capacitor ladder network as recited in claim 2 wherein each of said plurality of first capacitors is composed of a trimming network comprising M capacitors connected in parallel and having capacitance values equal to said first capacitance value divided by $2^m$ wherein $m$ varies from one to M, the value of the combined capacitance of said parallel M capacitors being approximately equal to said first capacitance value.

6. The improvement in said switched capacitor ladder network as recited in claim 5 wherein each of said plurality of switch means comprises M FET switch pairs, one FET switch of each pair being connected between a corresponding one of said M capacitors and said first reference potential and the other FET switch of the pair being connected between the same capacitor and one or the other of said first and second reference potentials said capacitor ladder network being trimmed by the choice of the connection of said other FET switch to said first or second reference potential, the gates of corresponding ones of each M FET switch pairs being connected in common, said plurality of switch means being adapted to being gated by a digital word composed of a like plurality of binary bits.

7. The improvement in said switched capacitor ladder network as recited in claim 5 wherein each one of the said plurality of conductive layers is composed of M connected juxtaposed conductive layers, superposed to corresponding separate diffused regions in said substrate.

8. The improvement in said switched capacitor ladder network as recited in claim 7 wherein said substrate is silicon, said insulating layer is silicon dioxide, said plurality of M connected juxtaposed conductive layers are polysilicon, and said metalized regions are aluminum.

* * * * *

UNITED STATES PATENT AND TRADEMARK OFFICE
CERTIFICATE OF CORRECTION

PATENT NO. : 4,028,694
DATED : June 7, 1977
INVENTOR(S) : Peter William Cook and Stanley E. Schuster It is certified that error appears in the above-identified patent and that said Letters Patent are hereby corrected as shown below:

Column 1, line 9, after "to" (second occurrence), delete "a".

Column 2, line 58, "outputjunction" should be --output junction--.

Column 2, line 63, change the equation to read as follows:

$$--V_o = V_R (d_1 2^{-1} + d_2 2^{-2} + \ldots + d_n 2^{-n})--$$

Column 4, line 26, "leat" should be --least--.

Column 4, line 37, the equation should read as follows:

$$--V_o = V_R (\alpha_1 d_2 2^{-1} + \alpha_2 d_2 2^{-2} + \ldots + \alpha_n d_n 2^{-n}) \qquad (2)--$$

Column 4, line 54, "The venin" should be --Thévenin--.

Column 5, line 28, "Shcuster" should be --Schuster--.

Column 5, line 29, "Lunch" should be --Lynch--.

Column 5, line 48, "$1_i$" should be --$b_i$--.

Column 8, line 22, "siad" (second occurrence) should be --said--.

*Signed and Sealed this*

*Fourteenth* Day of *February 1978*

[SEAL]

Attest:

RUTH C. MASON
*Attesting Officer*

LUTRELLE F. PARKER
*Acting Commissioner of Patents and Trademarks*